United States Patent
Bhattacharya et al.

(10) Patent No.: US 8,586,506 B2
(45) Date of Patent: Nov. 19, 2013

(54) ELECTRODEPOSITION OF BIAXIALLY TEXTURED LAYERS ON A SUBSTRATE

(75) Inventors: Raghu N. Bhattacharya, Littleton, CO (US); Sovannary Phok, Lakewood, CO (US); Priscila Spagnol, Boulder, CO (US); Tapas Chaudhuri, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 184 days.

(21) Appl. No.: 11/817,452

(22) PCT Filed: Aug. 1, 2005

(86) PCT No.: PCT/US2005/027263
§ 371 (c)(1),
(2), (4) Date: Aug. 30, 2007

(87) PCT Pub. No.: WO2007/015692
PCT Pub. Date: Feb. 8, 2007

(65) Prior Publication Data
US 2010/0167084 A1    Jul. 1, 2010

(51) Int. Cl.
*H01L 39/24*     (2006.01)
*C25D 7/00*      (2006.01)
*C25D 9/04*      (2006.01)
*B32B 15/04*     (2006.01)

(52) U.S. Cl.
USPC ........... 505/472; 505/470; 505/434; 505/500; 505/510; 205/51; 205/170; 205/148; 205/227; 428/701

(58) Field of Classification Search
USPC ......... 505/430, 434, 472, 238, 470, 500, 510; 205/51, 148, 170, 183, 196, 261, 227, 205/238, 224, 333; 428/697–702, 930, 637, 428/655, 670, 680, 672; 427/523, 528
See application file for complete search history.

(56) References Cited

U.S. PATENT DOCUMENTS

| 5,741,377 A | 4/1998 | Goyal et al. |
| 6,106,615 A * | 8/2000 | Goyal et al. ................ 117/84 |

(Continued)

FOREIGN PATENT DOCUMENTS

| JP | 2004-307997 A | 4/2004 |
| WO | 0183855 A1 | 11/2001 |

(Continued)

OTHER PUBLICATIONS

Annex to the European Search Report on European Patent Application No.

(Continued)

*Primary Examiner* — Stanley Silverman
*Assistant Examiner* — Kallambella Vijayakumar
(74) *Attorney, Agent, or Firm* — Paul J. White; W. LaNelle Owens

(57) ABSTRACT

Methods of producing one or more biaxially textured layer on a substrate, and articles produced by the methods, are disclosed. An exemplary method may comprise electrodepositing on the substrate a precursor material selected from the group consisting of rare earths, transition metals, actinide, lanthanides, and oxides thereof. An exemplary article (150) may comprise a biaxially textured base material (130), and at least one biaxially textured layer (110) selected from the group consisting of rare earths, transition metals, actinides, lanthanides, and oxides thereof. The at least one biaxially textured layer (110) is formed by electrodeposition on the biaxially textured base material (130).

16 Claims, 16 Drawing Sheets

(56) References Cited

U.S. PATENT DOCUMENTS

| | | | |
|---|---|---|---|
| 6,332,967 B1 * | 12/2001 | Bhattacharya | 205/51 |
| 6,537,689 B2 * | 3/2003 | Schoop et al. | 428/701 |
| 6,670,308 B2 * | 12/2003 | Goyal | 505/434 |
| 2003/0036483 A1 * | 2/2003 | Arendt et al. | 505/239 |
| 2004/0033904 A1 | 2/2004 | Moore et al. | |
| 2004/0157747 A1 * | 8/2004 | Chen et al. | 505/238 |
| 2004/0195105 A1 | 10/2004 | Yoo et al. | |
| 2005/0239658 A1 * | 10/2005 | Paranthaman et al. | 505/300 |

FOREIGN PATENT DOCUMENTS

| | | |
|---|---|---|
| WO | 2004-059041 | 7/2004 |
| WO | WO 2004/059041 A1 | 7/2004 |

OTHER PUBLICATIONS

International Search Report for International (PCT) Application No. PCT/US2005/027263, mailed Mar. 13, 2006.
Written Opinion for International (PCT) Application No. PCT/US2005/027263, mailed Mar. 13, 2006.
International Preliminary Report on Patentability for International (PCT) Application No. PCT/US2005/027263, mailed Feb. 14, 2008.
Office Action issued by the Japanese Patent Office on Apr. 12, 2011, Application No. JP 524945/2008 (English Translation Provided).
Annex to the European Search Report on European Patent Application No. 05810135; 2009.

* cited by examiner

Sm:CeO₂ (111) reflection

ELECTRODEPOSITION OF BIAXIALLY TEXTURED LAYERS ON A SUBSTRATE

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

TECHNICAL FIELD

The described subject matter relates to biaxially textured substrates, and more specifically, to electrodeposition of biaxially textured layers on a substrate.

BACKGROUND

Superconducting materials are characterized by their very desirable ability to conduct electricity without resistance. These superconducting materials can be deposited onto a variety of substrates for use in a variety of applications, including, e.g., conductive wires, tapes, and electronic devices. To be commercially viable, superconducting materials used in these applications must have a high critical current density ($J_c$) (i.e., the maximum current density a superconductor can carry at a given temperature and magnetic field) because high electrical current is required to power any significant load. It has been shown that superconducting materials formed with biaxially textured crystalline structures have superior critical current densities.

Generally, texturing refers to a cluster structure comprising a number of crystal particles that have the same crystal orientation (e.g., longitudinal axial direction) in a polycrystalline or other material. Biaxial texturing describes material in which a significant number of the crystal particles in the cluster structures are oriented generally uniformly in all of the three axes. When viewed under a microscope, biaxially textured superconductor materials appear to have numerous, elongated, crystalline structures oriented in a common longitudinal direction.

It is now well established that biaxially textured crystalline substrates are critical to obtaining superior critical current densities ($J_c$) for $YBa_2Cu_3O_{7-\delta}$ (YBCO) superconductors. One way to accomplish biaxial texturing in a superconducting material is to grow epitaxial YBCO onto biaxially textured substrates. Rolling-assisted biaxially textured substrate technology has also proven to be very promising for fabricating YBCO-coated conductors that can support large currents in high magnetic fields at 77 K.

In any case, buffer layers are the key component in YBCO superconductors based on rolling-assisted biaxially textured substrates, such as, Ni and nickel alloys. These buffer layers provide a chemically inert, continuous and smooth base for the growth of the YBCO layer, while transferring the biaxial texture from the substrate to the high-temperature superconductor (HTS) layer. Buffer layers also act as barriers to prevent the diffusion of metal to the HTS layer and oxidation of the metal substrate, because YBCO is processed at about 800° C. in an oxygen atmosphere of 100 ppm or more.

Recently, more attention has been given to paramagnetic Ni—W substrates to improve mechanical properties and reduce magnetism. Growth of oxide buffer layers directly on textured paramagnetic Ni—W substrates under typical conditions is challenging because the localized formation of tungsten oxide can deteriorate the properties of oxide buffer layers and YBCO layers. Currently, Ni—W substrates are sulfurized to form a protective sulfide surface layer. Commercial-quality buffer-layer architectures deposited on sulfurized Ni—W are typically $CeO_2/YSZ/Y_2O_3/Ni$—W and $CeO_2/YSZ/CeO_2/Ni$—W. At present, the buffer layers are typically deposited by direct current (DC) magnetron sputtering and pulsed-laser deposition (PLD), which operate at relatively slow deposition rates.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

An exemplary method of producing at least one biaxially textured layer on a substrate may comprise electrodepositing on the substrate a precursor material selected from the group consisting of rare earths, transition metals, actinides, lanthanides, and oxides thereof. The method may be implemented to produce, e.g., a biaxially textured article. The method may also be implemented to produce, e.g., a superconductor having a biaxially textured layer.

Another exemplary method of producing a superconducting material having at least one biaxially textured layer may comprise: selecting a precursor material from the group consisting of rare earths, transition metals, actinides, lanthanides, and oxides thereof; and electrodepositing the selected precursor material on a biaxially textured substrate.

An exemplary biaxially textured material may comprise a biaxially textured base material, and at least one biaxially textured layer selected from the group consisting of rare earths, transition metals, actinides, lanthanides, and oxides thereof. The at least one biaxially textured layer is formed by electrodeposition on the biaxially textured base material.

In exemplary embodiments, the substrate may be nickel-based, such as, e.g., Ni metal or Ni—W. Also in exemplary embodiments, the precursor material may be selected from the group consisting of $CeO_2$, doped $CeO_2$, $La_2O_3$, Ir, Ni—Ir, Ni, YSZ, $Y_2O_3$, and La—Mn—O.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Briefly, biaxial texturing is accomplished by depositing one or more precursor materials onto a substrate, which itself has a biaxial texture. During the deposition, the growing crystalline particles conform to the same biaxially textured, crystalline orientation of the substrate. By growing a superconductor layer on a biaxially textured substrate, the biaxial texturing of the substrate is maintained in the resulting superconductor article.

Biaxially textured layers may be prepared on a substrate inexpensively by an electrodeposition method. Electrodeposition is a low-cost, non-vacuum, high-rate deposition process that deposits uniform layer (or "layers") on large non-planar substrates. Exemplary embodiments discussed herein include biaxially textured layers of rare earths, transition metals, actinides, lanthanides, and oxides thereof. For example, the precursor material may be selected from the group consisting of $CeO_2$, doped $CeO_2$, $La_2O_3$, Ir, Ni—Ir, Ni, YSZ, $Y_2O_3$, and La—Mn—O.

Figure 1:
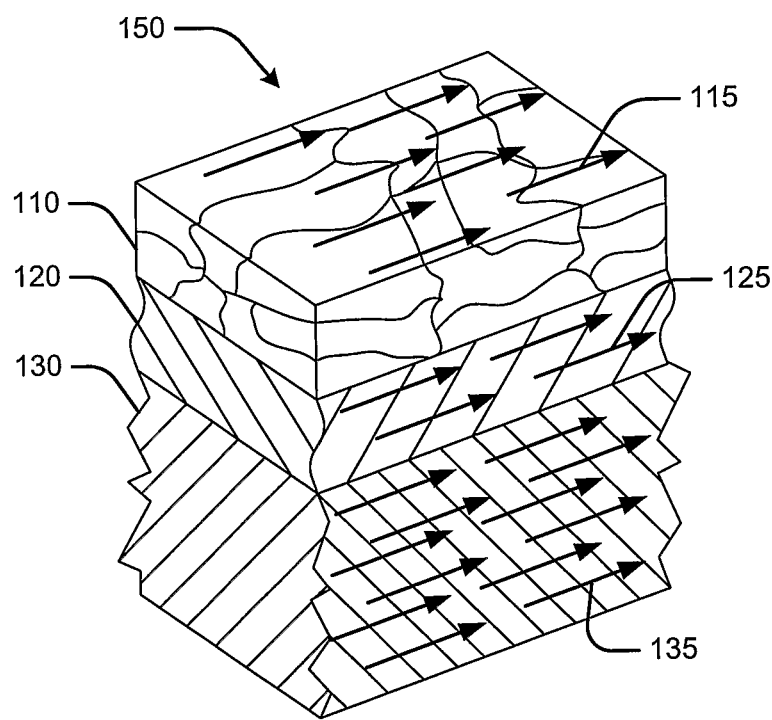
FIG. 1 shows an exemplary biaxially textured article as it may be produced according to the methods described herein.

FIG. 1 shows an exemplary biaxially textured article 150 as it may be produced according to the methods described herein. Exemplary biaxially textured article 150 is shown having an outer layer 110 grown epitaxially over a buffer layer 120 on a substrate 130. It is noted, however, that the biaxially textured article 150 need not include two layers 110 and 120. For example, only one layer may be applied, or more than two layers may be applied.

As used herein, the term "biaxial texturing" refers to both partial and complete biaxial texturing, e.g., as indicated by X-ray diffraction scans. Each layer 110 and 120 may be textured relative to the substrate 130 such that the layers 110 and 120 have the same biaxial crystalline orientation as the substrate 130. That is, the biaxial texturing of the substrate 130 (indicated by arrows 135) induces corresponding biaxial texturing in the buffer layer 120 (indicated by arrows 125), which in turn induces corresponding biaxial texturing in the in outer layer 110, (indicated by arrows 115).

The substrate 130 may be either a flexible or rigid metal or other material that can be fabricated into a variety of shapes, sizes and thicknesses. The substrate 130 may have any desired thickness, e.g., between about 0.005 and 0.5 millimeters (mm). Suitable metals include, but are not limited to, nickel, copper, titanium, palladium, and/or combinations or alloys thereof (e.g., nickel-tungsten (Ni—W) and nickel-chromium alloys).

The substrate 130 may be biaxially textured, e.g., by a well-known process referred to as rolling-assisted biaxially textured substrates (RABiTS). While a biaxially textured substrate 130 is not required, use of a biaxially textured substrate 130 may enhance the ability to achieve biaxial texturing in the layers 110 and 120.

The layers 110 and 120 may be deposited onto the substrate 130 by electrodeposition in a chemical bath. Electrodeposition is generally performed at between about 0.05 and 25 $mA/cm^2$, for between about 1 and 45 minutes, as discussed in more detail below in the Examples. Thicker layers may be produced by increasing the deposition time and/or a multi-layer deposition process. In a multilayer deposition process, electrodeposited layer 120 has biaxial texturing, which provides an optimal surface for electrodeposition of the next layer 110.

After electrodeposition, biaxial texturing may be enhanced by annealing in a suitable gas or mixture of gasses, such as, e.g., argon (Ar) and a forming gas. The annealing process may be performed at between about 750 and 1200° C. for between about 12 and 48 hours. Of course, any suitable annealing process may be implemented.

Having generally described biaxial textured articles and methods of production, the articles and methods may be better understood with reference to the following exemplary embodiments.

Electrodeposition of $CeO_2$. $CeO_2$ and doped $CeO_2$ layers may be electrodeposited on a biaxially textured nickel-based substrate, e.g., to form a buffer layer as follows. In an exemplary embodiment, a $CeO_2$ layer (undoped) may be prepared in a bath containing cerium salt dissolved in deionized water. In other exemplary embodiments, doped $CeO_2$ layers may be prepared, e.g., using samarium (Sm), gadolinium (Gd), and zirconium (Zr) or other elements, especially rare earths, transition, lanthanides and actinides. For purposes of illustration, a Sm-doped $CeO_2$ layer may be prepared in a bath containing cerium salt and samarium salt dissolved in deionized water. A Gd-doped $CeO_2$ layer may be prepared in a bath containing cerium salt and gadolinium salt dissolved in deionized water. A Zr-doped $CeO_2$ layer may be prepared from a bath containing cerium salt and zirconium salt dissolved in deionized water.

During exemplary production, the layers may be electrodeposited in a vertical cell in which the electrodes (both working and counter electrodes) are suspended vertically from the top of the cell. Electrodeposition of the layers on a substrate may be performed at room temperature (about 22 to 25° C.) with constant stirring.

The substrate may be a nickel-based substrate, such as, Ni—W (3% by weight or 3 wt %). In an exemplary embodiment, the substrate may be a flat, 10 centimeter (cm)×0.5 cm, Ni—W substrate, improved by an electropolishing technique. The electropolishing technique may include providing the substrate in a 5 vol % hydrazine hydrate solution at +0.6 V, where the Pt counter and Pt pseudo-reference electrode are shorted together.

The electrodeposition precursors may be prepared at a commercially favorable constant current mode of about −2 volts (V), where the platinum (Pt) counter and Pt pseudo-reference electrodes are shorted together. The duration of electrodeposition may be less than 50 minutes, e.g., in the range of 3 to 20 minutes. A Princeton Applied Research potentiostat/galvanostat (Model 273A) with an IBM PC AT computer interface may be used to prepare the electrodeposition layers.

In an exemplary embodiment, the electrodeposited layers may be characterized by X-ray diffraction (XRD), in $\theta/2\theta$ geometry, using $CuK_{\alpha 1}$ radiation ($\lambda$=1.5406 nm). Out-of-plane alignment may be determined from an omega scan on the (200) $CeO_2$ reflection. In-plane alignment may be estimated from a pole figure and phi scans on the $CeO_2$ (111) reflection. The Gaussian distribution may be fitted to the phi- and omega-scan data to estimate full width at half maximum (FWHM). Layer morphology may be observed by scanning electron micrographs (SEM). Electrodeposited layer roughness may also be estimated from Atomic Force Microscopy (AFM) scans.

Figure 2A:
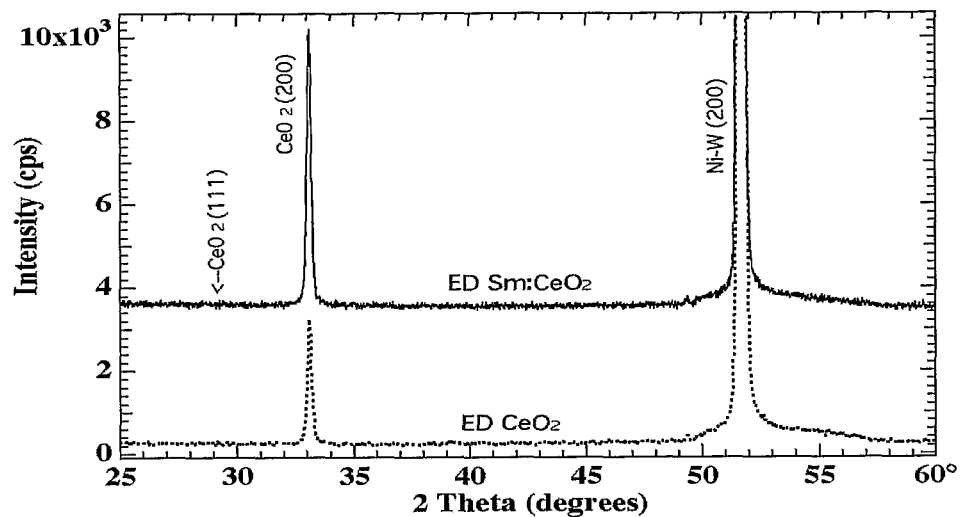
FIG. 2a is a representative XRD scan for annealed $CeO_2$ and $CeO_2$:Sm prepared on a Ni—W substrate.
Figure 2B:
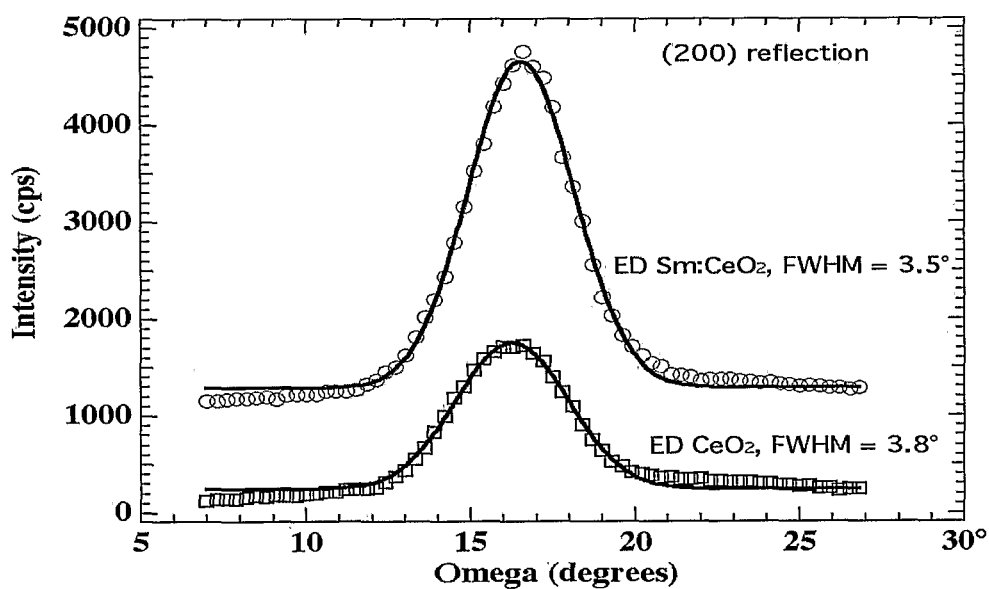
FIG. 2b is a representative omega scan on the (200) reflection for the annealed $CeO_2$ and $CeO_2$:Sm prepared on a Ni—W substrate.
Figure 3A:
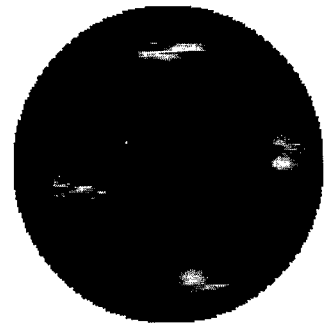
FIGS. 3a and 3b are representative pole-figure scans for the annealed $CeO_2$ and $CeO_2$:Sm prepared on a Ni—W substrate.
Figure 3B:
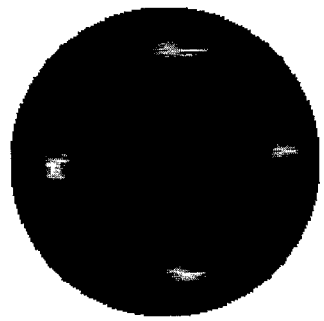

FIG. 2a is a representative XRD scan for annealed $CeO_2$ and $CeO_2$:Sm prepared on a Ni—W substrate. It is observed that only the c-axis-oriented (200) $CeO_2$ reflection can be identified, but the intensity of Sm-doped layers is much higher due to better crystallinity and greater thickness. FIG. 2b is a representative omega scan on the (200) reflection for the annealed $CeO_2$ and $CeO_2$:Sm prepared on a Ni—W substrate. It is observed that the dispersion along the c-axis of the undoped $CeO_2$ and Sm-doped $CeO_2$ grains are as low as 3.8° and 3.5°, respectively. The omega-scan value of $CeO_2$ is better than the 7.4° reading for the base Ni—W substrate. FIGS. 3a and 3b are representative pole-figure scans for the annealed $CeO_2$ and $CeO_2$:Sm prepared on a Ni—W substrate. The pole-figure scans show that $CeO_2$ and $CeO_2$:Sm are biaxially textured.

Figure 4A:
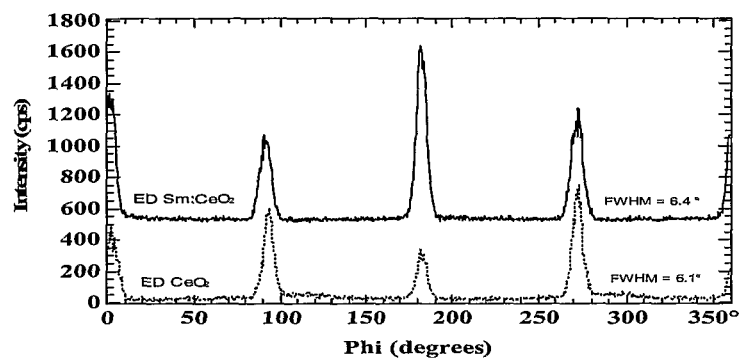
FIGS. 4a and 4b are representative phi scans of (a) the annealed $CeO_2$ and $CeO_2$:Sm and (b) the Ni—W substrate.
Figure 4B:
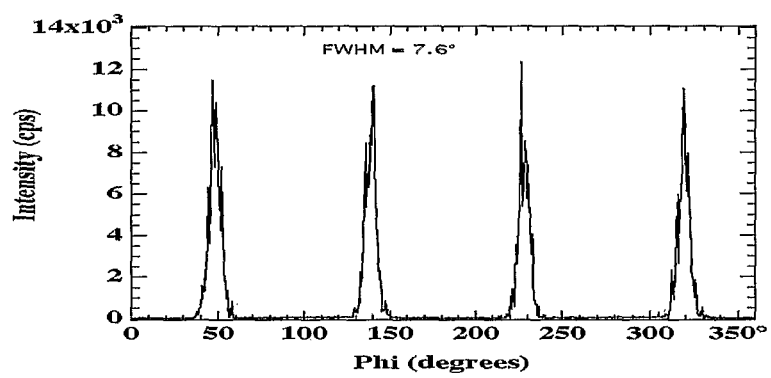
Figure 5A:
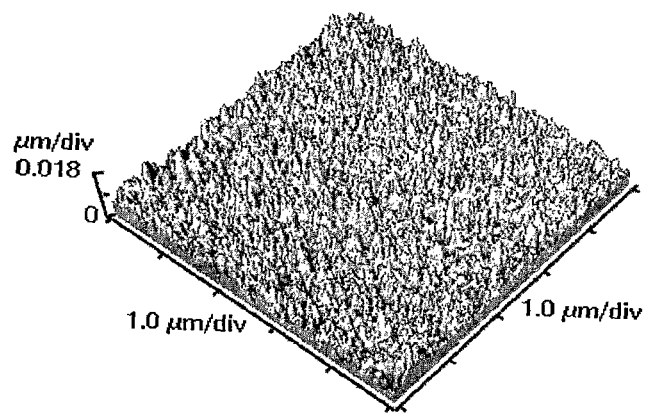
FIGS. 5a and 5b are AFM images of the $CeO_2$ and $CeO_2$:Sm layer.
Figure 5B:
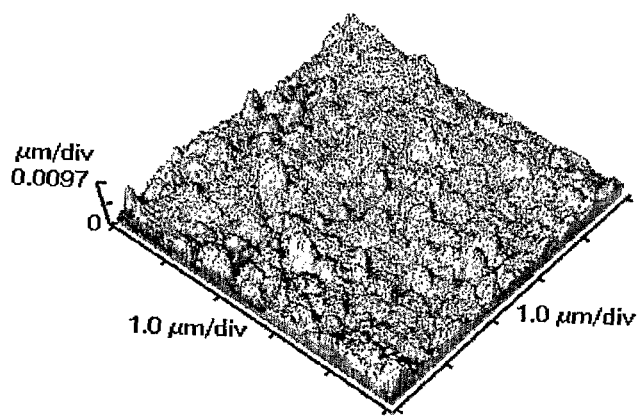
Figure 6A:
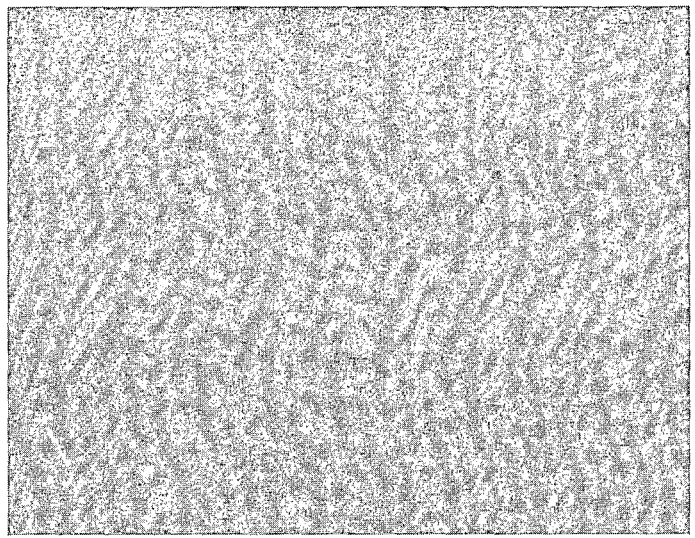
FIGS. 6a-d are scanning electron micrograph images of the $CeO_2$:Sm layer.
Figure 6B:
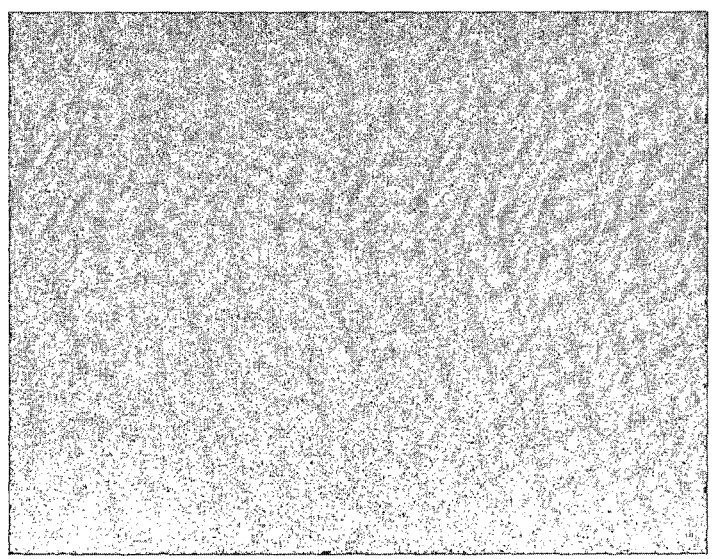
Figure 6C:
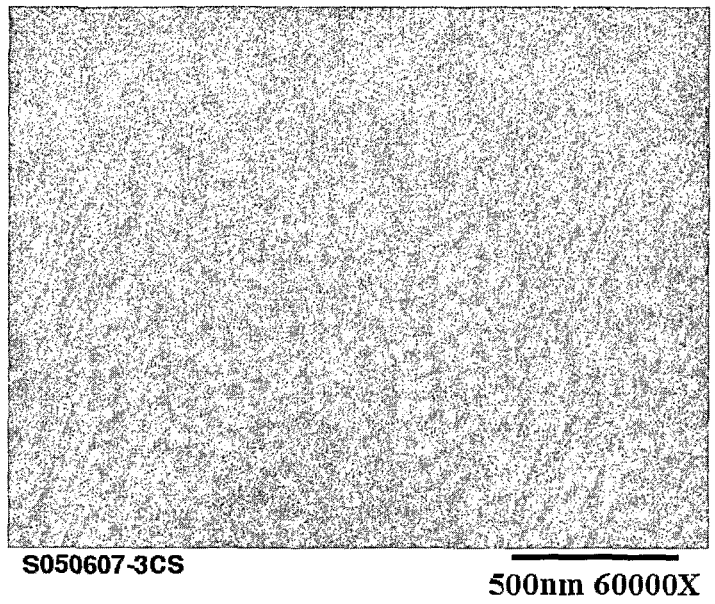
Figure 6D:
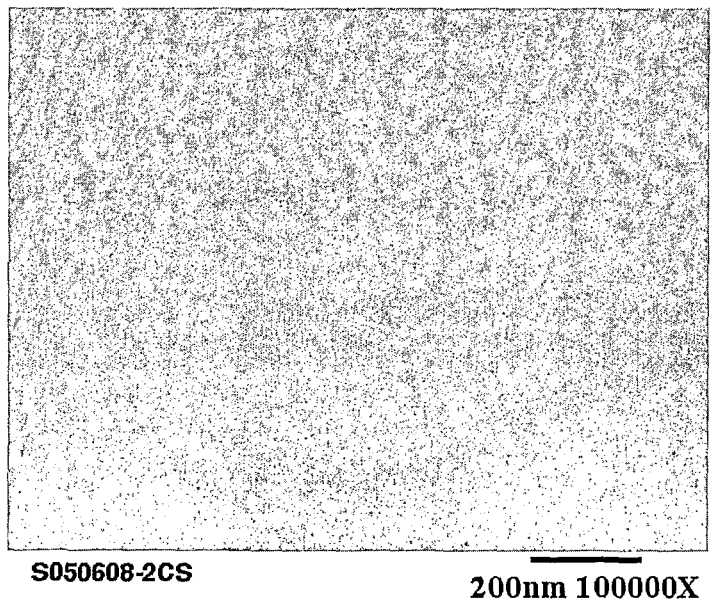

FIGS. 4a and 4b are representative phi scans of (a) the annealed $CeO_2$ and $CeO_2$:Sm, and (b) the Ni—W substrate. It is observed in FIG. 4a that an average in-plane mosaic spread from the phi scan of the $CeO_2$ layer is about 6.1°. The average in-plane mosaic spread from the phi scan of the $CeO_2$:Sm layer is about 6.4°. It is observed in FIG. 4b that an average in-plane mosaic spread from the phi-scan of the base Ni—W substrate is 7.6°. The improved values of omega and phi may be attributed to the relatively small grain size of the electrodeposited $CeO_2$ and $CeO_2$:Sm precursor layers, which also show better grain alignment after annealing. FIGS. 5a and 5b are AFM images of the $CeO_2$ and $CeO_2$:Sm layer. It is observed that the average layer roughness is about 3 nm. FIGS. 6a-d are SEM images of the $CeO_2$:Sm layer. It is observed that both layers are free from any cracks.

In an exemplary embodiment, pulsed laser deposition (PLD) may be implemented to deposit layers of buffer materials on the substrate. PLD is a well known technique, wherein a laser is focused on a target including the buffer material to be deposited. The incident laser generates a plume of buffer material from the target surface. The substrate is heated and positioned in the path of this plume to deposit the buffer material in the plume on the substrate. An exemplary YBCO superconductor may be produced, e.g., by PLD of a YSZ layer, PLD of a $CeO_2$ layer, and PLD of a YBCO layer over the electrodeposited $CeO_2$ layer to illustrate Ni inter-diffusion from the Ni—W substrate.

Figure 7A:
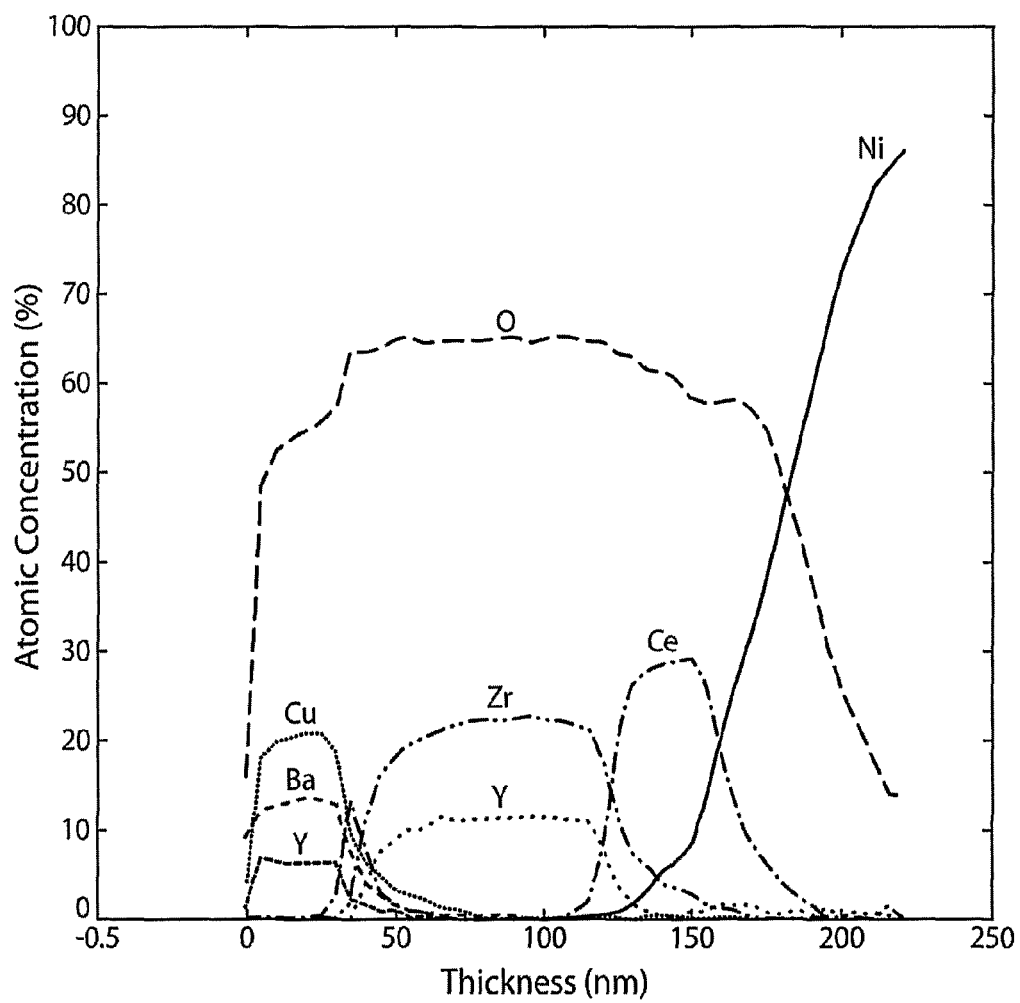
FIG. 7a shows an Atomic Emission Spectrometry (AES) analysis of a superconductor having the structure: YBCO/$CeO_2$/YSZ/ED-$CeO_2$/Ni—W.
Figure 7B:
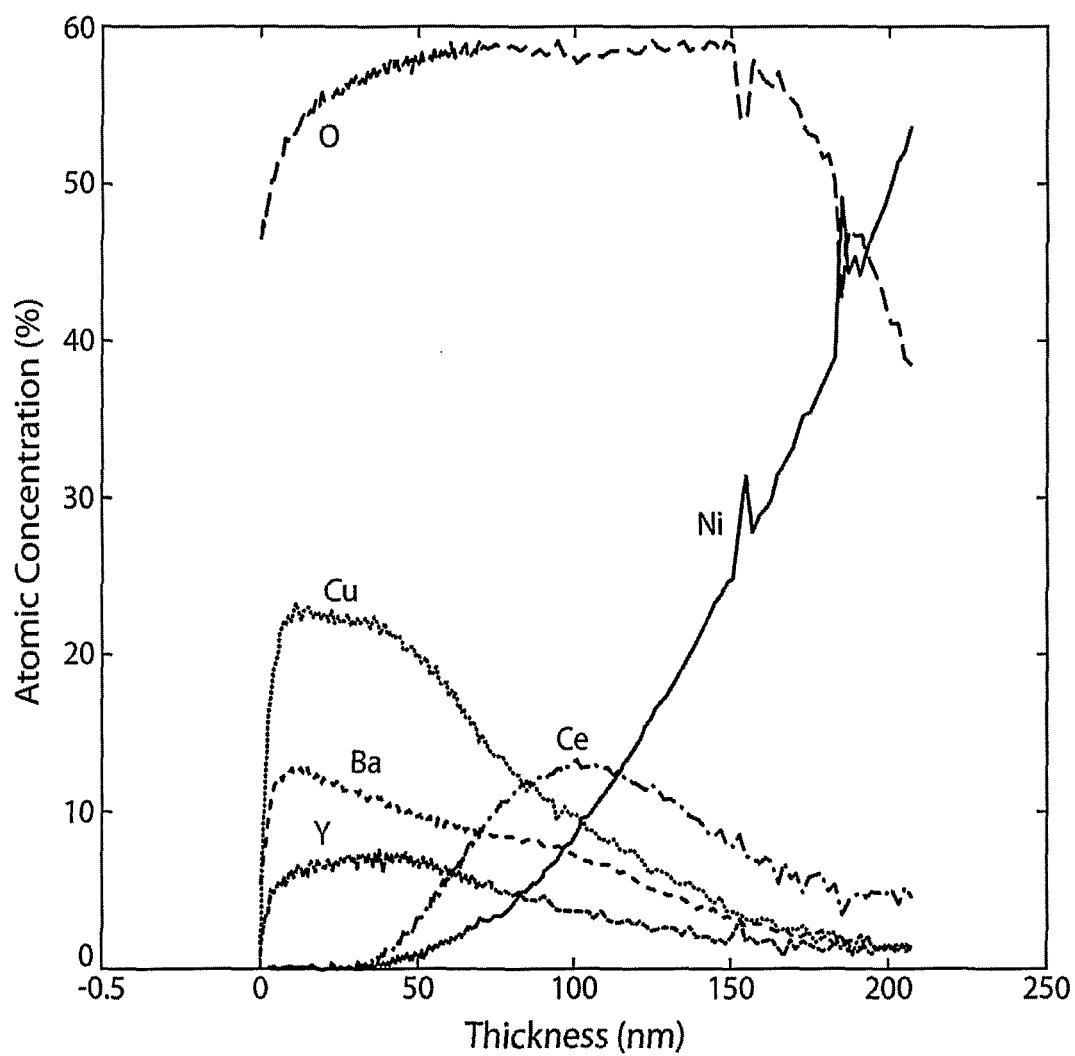
FIG. 7b shows an AES analysis of a YBCO superconductor directly on an ED-$CeO_2$/Ni—W substrate to qualify the simple buffer layer architecture.

FIG. 7a shows an Atomic Emission Spectrometry (AES) analysis of a superconductor having the structure: YBCO/$CeO_2$/YSZ/ED-$CeO_2$/Ni—W. It is observed that Ni inter-diffusion is completely stopped at the first electrodeposited $CeO_2$ layer. FIG. 7b shows an AES analysis of a YBCO superconductor directly on an ED-$CeO_2$/Ni—W substrate to qualify the simple buffer layer architecture. It is observed that Ni inter-diffusion is stopped, but Ni penetrates deep inside the $CeO_2$ layer.

Electrodeposition of Iridium. Iridium (Ir) has excellent oxidation and corrosion resistance. In addition, the lattice mismatch of cubic Ir (a=3.84 Å) is very close to that of $CeO_2$ [a=5.411 Å, a/(square root of 2)=3.826 Å] and Ni (a=3.524 Å), making iridium a good buffer layer for use in YBCO high-temperature superconductors.

In exemplary embodiments, iridium layers may be electrodeposited on a biaxially textured nickel-based substrate to form a buffer layer as follows. The iridium layer may be electrodeposited using a bath containing only Ir salt at 65° C. Again, a vertical cell may be implemented in which the electrodes (both working and counter) are suspended vertically from the top of the cell. The electrodeposition precursors may be prepared at about −1.2 V for 2 to 45 minutes on a Ni—W (3 wt %) substrate, where the Pt counter and Pt pseudo-reference electrodes are shorted together.

To qualify the electrodeposited Ir buffer layer, a pulsed laser deposition (PLD) $CeO_2$/YSZ/$CeO_2$ structure and a simplified PLD YSZ/$CeO_2$ structure may be deposited on top of the Ir-coated Ni—W substrates. The electrodeposited Ir/metal substrates are first heated to 800° C. in 500 mTorr of the forming gas, and then a $CeO_2$ seed layer is deposited in 180 mTorr of the forming gas. Subsequently, YSZ and $CeO_2$ layers are deposited sequentially in 0.1 mTorr of oxygen.

The PLD system may be a standard PLD chamber (Neocera) and an excimer KrF laser (Lambda Physik, Compex 201, $\lambda$=248 nm) operated at 260 mJ and 10 Hz. The laser beam may be focused onto a 3×1 $cm^2$ spot on a target at a 45° angle, with a fluence of 2-3 J/$cm^2$. The surface of YSZ (3 mole % $Y_2O_3$) and $CeO_2$ targets may be cleaned in situ by exposure to 1000 laser shots prior to every deposition. The substrates may be mounted on the substrate holder-cum-heater, and the chamber evacuated to a base pressure of about $10^{-6}$ torr prior to deposition. The target-to-substrate distance is kept at about 8 cm, and layers of YSZ and $CeO_2$ are deposited sequentially. The electrodeposited layers may be characterized by X-ray diffraction (XRD), in $\theta/2\theta$ geometry, using $CuK_{\alpha 1}$ radiation ($\lambda$=1.5406 nm).

Figure 8:
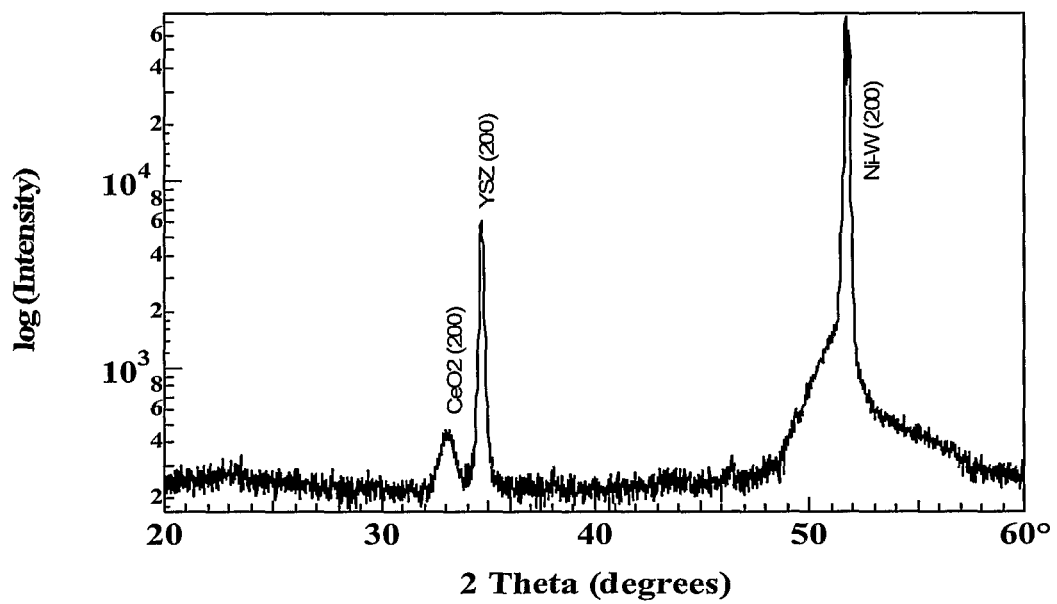
FIG. 8 is a representative XRD diagram of a CYC/Ir buffer layer electrodeposited on a Ni—W substrate.

FIG. 8 is a representative XRD diagram of a CYC/Ir buffer layer electrodeposited on a Ni—W substrate. The XRD diagram of $CeO_2$/YSZ/$CeO_2$/Ir/Ni—W shows the epitaxial (001) phase formation for each deposited layer. No NiO phase formation was observed on this type of buffer architecture, even though the layers were annealed at 800° C. Out-of-plane omega values of the biaxially textured buffer layers were 6.5° and 8.7° for YSZ(200) and $CeO_2$(200), respectively.

Figure 9A:
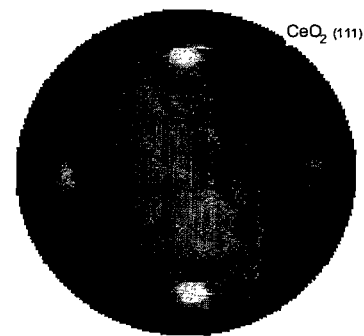
FIGS. 9a and 9b are representative pole-figure scans for (a) the $CeO_2$ and (b) the YSZ of respective layers prepared on a Ni—W substrate.
Figure 9B:
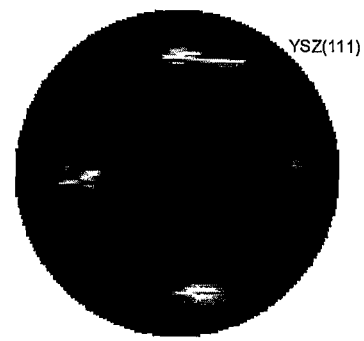
Figure 10A:
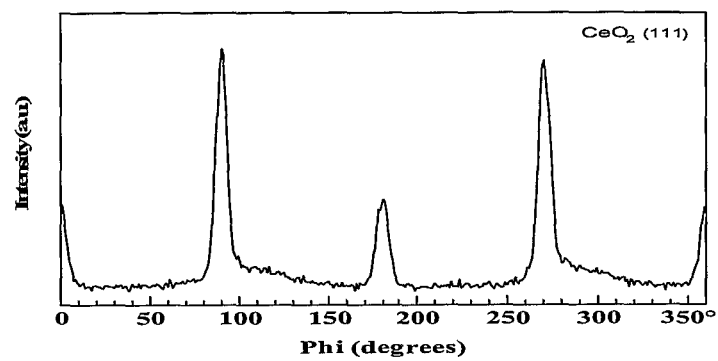
FIGS. 10a and 10b are representative phi scans of (a) the $CeO_2$ and (b) the YSZ layers prepared on a Ni—W substrate.
Figure 10B:
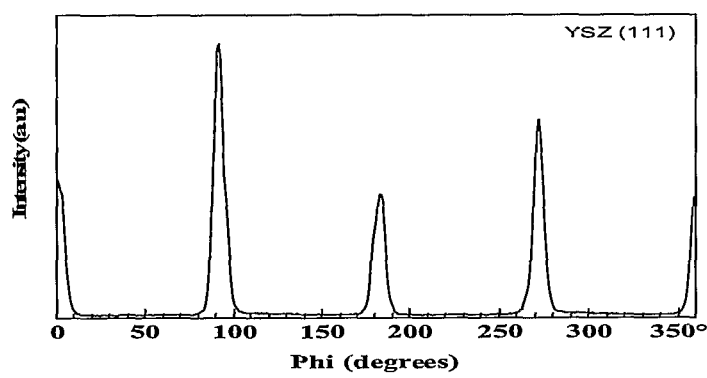

FIGS. 9a and 9b are representative pole-figure scans for (a) the $CeO_2$ and (b) the YSZ layers prepared on a Ni—W substrate. It is observed that the $CeO_2$ top layer and YSZ are cube-textured. FIGS. 10a and 10b are representative phi scans of (a) the $CeO_2$ and (b) the YSZ of respective layers prepared on a Ni—W substrate. It is observed that the in-plane texture values (phi scan) of YSZ and $CeO_2$ were 7.0° and 8.0°, respectively. These values are comparable to the Ni—W substrate ($\Delta\omega$=7.0° and $\Delta\phi$=7.5°, indicating the good epitaxial nature of the $CeO_2$/YSZ/$CeO_2$/Ir/Ni—W configuration.

It is noted that an initial $CeO_2$ layer is not needed to produce electrodeposited Ir on a Ni-based substrate. In an exemplary embodiment, the final buffer layer configuration may be $CeO_2$/YSZ/Ir on a Ni—W substrate. Results for these structures are comparable to the CYC/Ir configuration, and indicate a cube texture.

Figure 11A:
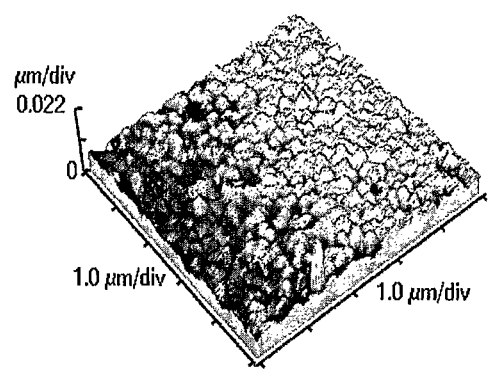
FIGS. 11a and 11b are atomic force microscopy (AFM) micrographs of (a) $CeO_2$/YSZ/$CeO_2$/Ir/Ni—W and (b) $CeO_2$/YSZ/Ir/Ni—W.
Figure 11B:
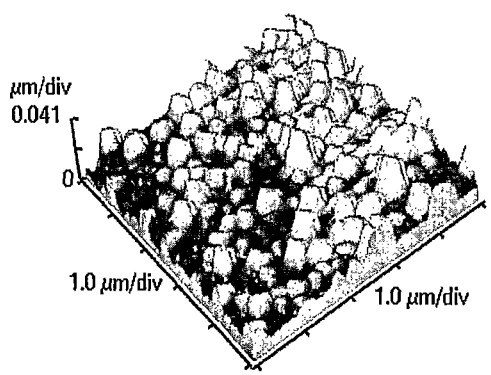
Figure 12A:
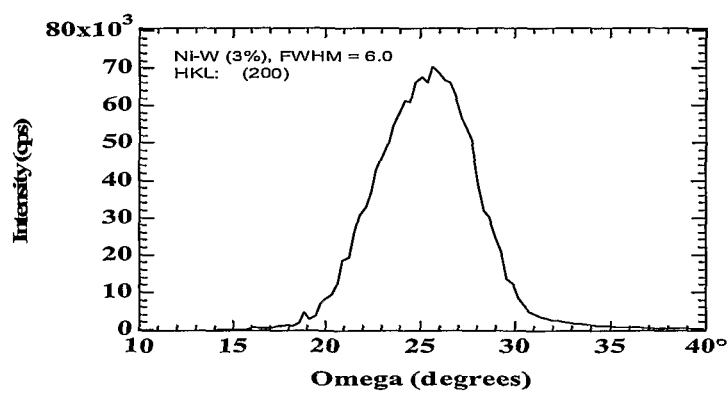
FIGS. 12a-d are XRD omega and Phi scans of (a and b) a Ni—W substrate, and (c and d) electrodeposited Ni on a Ni—W substrate.
Figure 12B:
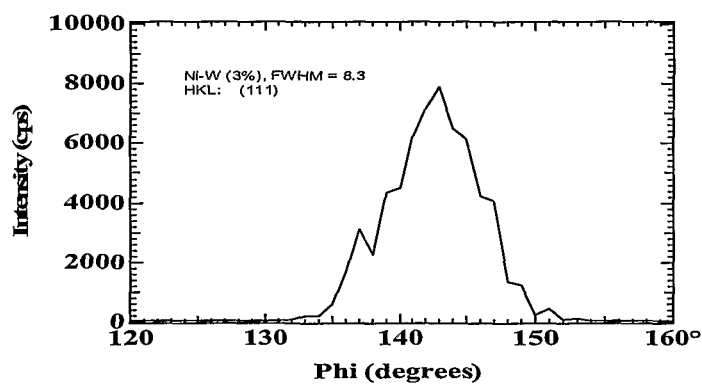
Figure 12C:
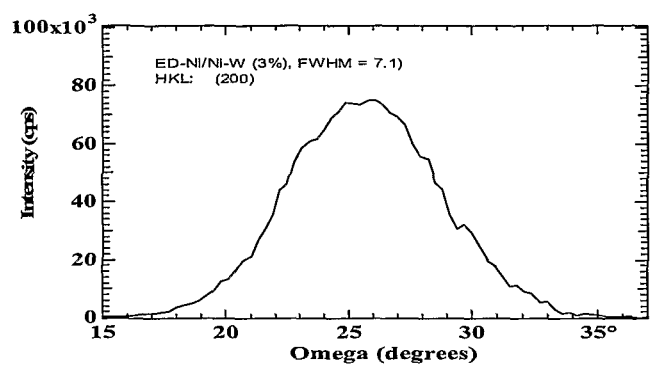
Figure 12D:
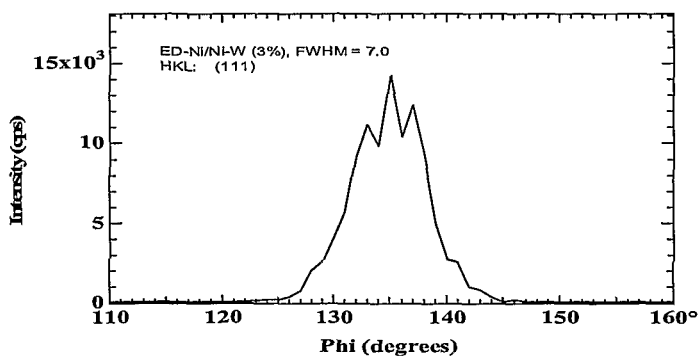

FIGS. 11a and 11b are atomic force microscopy (AFM) micrographs of (a) $CeO_2$/YSZ/$CeO_2$/Ir/Ni—W and (b) $CeO_2$/YSZ/Ir/Ni—W. The AFM micrographs show smooth, continuous, crack-free buffer architectures for both $CeO_2$/YSZ/$CeO_2$/Ir/Ni—W and $CeO_2$/YSZ/Ir/Ni—W. The average roughness is about 3 nm for the CY/Ir/Ni—W, and about 9 nm for the CYC/Ir/Ni—W.

Electrodeposition of Ni. Electrodeposition of Ni may be performed using a bath containing 66 g $NiSO_4.xH_2O$, 9 g $NiCl_2 \cdot 6H_2O$, and 7.6 g boric acid dissolved in 200 mL of deionized water. Again, the layers may be deposited in a vertical cell in which the electrodes (both working and counter) are suspended vertically from the top of the cell at 65° C. and without stirring.

The electrodeposition precursors may be prepared by applying 0.4 $mA/cm^2$ current density at 65° C. for 60 minutes, where the Pt counter and Pt pseudo-reference electrode are shorted together. The Ni—W substrate may be improved by an electro-polishing technique. Electropolishing of the Ni—W substrate may be done in 5 vol % hydrazine hydrate solution at −50 $\mu A/cm^2$ (at a corresponding voltage of about +0.8 V) where the Pt counter and Pt pseudo-reference electrode are shorted together.

A Princeton Applied Research potentiostat/galvanostat Model 273 A with an IBM PC AT computer interface may be used to prepare electrodeposition layers. The thickness of the electrodeposition Ni layers is about 2.0 μm. The as-electrodeposited Ni layers are biaxially textured crystalline layers.

The buffer structures are completed on these types of seed ED-Ni layers by PLD $CeO_2$/YSZ/$CeO_2$. Specifically, the electrodeposited Ni/Ni—W (3%) layer may be annealed at 850° C. in 1 torr forming gas. A $CeO_2$ seed layer may be deposited at 850° C. in 180 mtorr forming gas. The subsequent YSZ and $CeO_2$ cap layers may be deposited at 850° C. in 0.1 mtorr oxygen.

The qualities of the ED-Ni layer may be assessed by depositing a PLD YBCO layer. Again, PLD deposition of 300-nm-thick YBCO may be performed using a KrF excimer laser system, operated at a fluence of 2-3 $J/cm^2$, the substrate held at 780° C. under an oxygen partial pressure of 150 mtorr. After YBCO deposition, 0.5-μm-thick silver (Ag) contacts may be deposited by DC magnetron sputtering, and the samples annealed in flowing oxygen at 500° C. for 90 min. Transport critical current ($J_c$) measurements may be performed at liquid nitrogen (~77 K) in varying applied magnetic fields using a standard 4-probe technique and the 1 μV/cm criterion.

FIGS. 12a-d are XRD Omega and Phi scans of (a and b) a Ni—W substrate, and (c and d) electrodeposited Ni on a Ni—W substrate. Full-width at half-maximum (FWHM) values of the ω scan (out-of-plane) and φ scan (in-plane) of the Ni—W substrate are (a) 6.0° and (b) 8.3°. Full-width at half-maximum (FWHM) values of the ω scan (out-of-plane) and φ scan (in-plane) of the electrodeposited Ni layer are (c) 7.1° and (d) 7.0°, which is comparable to the base Ni—W (3%) substrates and indicates good biaxial texturing. The relatively small grain size of the electrodeposited Ni layer is helpful for growing a higher-quality superconductor layer.

Figure 13A:
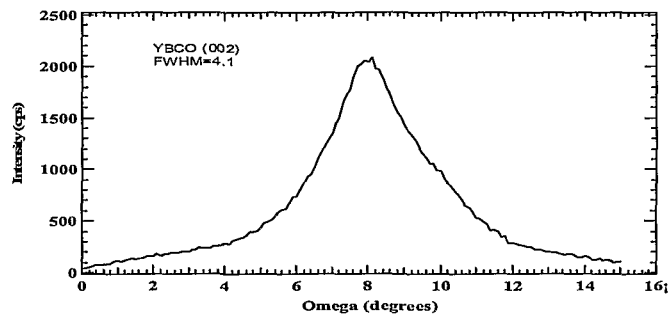
FIGS. 13a and 13b are representative (a) XRD omega scan of YBCO superconductor on ED-Ni/Ni—W, and (b) XRD Phi scan of YBCO superconductor on ED-Ni/Ni—W.
Figure 13B:
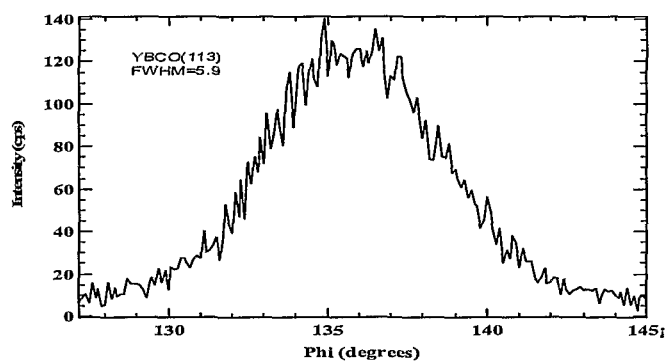
Figure 14:
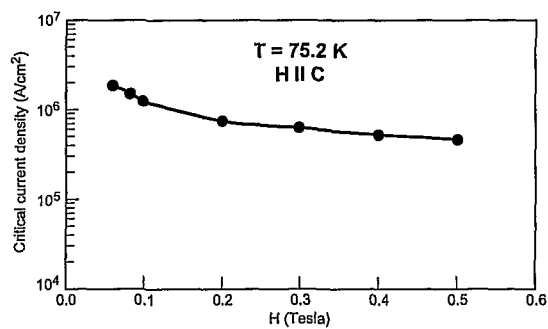
FIG. 14 is a plot of the critical current density versus field of a PLD YBCO/CYC/ED-Ni/Ni—W structure.

FIGS. 13a and 13b are representative XRD omega and Phi scans of (a) YBCO superconductor on ED-Ni/Ni—W, and (b) YBCO superconductor on ED-Ni/Ni—W. The XRD theta/2 theta scans show very good YBCO phase formation with some impurity-Ni (111) phase. FIG. 14 is a plot of the critical current density versus field of a PLD YBCO/CYC/ED-Ni/Ni—W structure. It is observed that the critical current density at varying magnetic fields for a YBCO layer grown on an ED-Ni-based buffer layer is about 1.8 $MA/cm^2$ at 75.2K in a 600 Gauss magnetic field.

It is readily appreciated that applications of the technology described herein may include, but are not limited to, superconductors, semiconductors, ferroelectrics, pyroelectrics, magnetic, optics, sensors, semiconductor layers, and photovoltaic. In an exemplary application, high temperature superconductors may be produced by electrodepositing high temperature superconducting materials on the buffer layer to produce, e.g., Y—$Ba_2Cu_3O_x$ (YBCO), Bi—Sr—Ca—Cu—O (BSCCO), Tl—Ba—Ca—Cu—O (TBCCO), Pb—Ba—Sr—Ca—Cu—O (PBSCCO), Tl—Sr—Ba—Ca—Cu—O (TSBCCO), Tl—Pb—Sr—Ba—Ca—Cu—O (TPSBCCO), Hg—Ba—Ca—Cu—O (HBCCO). The superconducting material may be deposited epitaxially, such that the superconducting material has the same crystalline orientation as the buffer layer. In other exemplary applications, crystalline silicon may be grown on the substrate to produce solar cells. Still other applications are also contemplated and will become readily apparent to those having ordinary skill in the art after becoming familiar with the teachings herein.

EXAMPLES

The following examples are provided to further characterize the methods and articles described herein. These examples are illustrative and not intended to be limiting.

Electrodeposited $CeO_2$. In this example, biaxially textured $CeO_2$ was prepared on Ni and Ni—W substrates. Specifically, 0.5 g of cerium bromide was dissolved in 200 mL of water. The layer was electrodeposited by applying 0.26 $mA/cm^2$ current density at room temperature (about 22° C.) for 10 minutes. The solution was stirred during deposition. The electrodeposited layer was annealed at 980° C. in a mixture of Ar gas (95%) and a 5% forming gas [$H_2$ (10%)/$N_2$].

Electrodeposited Samarium Doped $CeO_2$. In this example, biaxially textured $CeO_2$:Sm was prepared on Ni and Ni—W substrates. Specifically, 0.5 g cerium bromide and 0.01 g Samarium bromine was dissolved in 200 mL of water. The layer was electrodeposited by applying 0.26 $mA/cm^2$ current density at room temperature (about 22° C.) for 15 minutes. The solution was stirred during deposition. The electrodeposited layer was annealed at 980° C. in a mixture of Ar gas (95%) and a 5% forming gas [$H_2$ (10%)/$N_2$].

Electrodeposited $CeO_2$:Gd. In this example, biaxially textured $CeO_2$:Gd was prepared on a Ni—W substrate. Specifically, 0.5 g cerium bromide and 0.02 g gadolinium bromine was dissolved in 200 mL of water. The layer was electrodeposited by applying 0.3 $mA/cm^2$ current density at room temperature (about 22° C.) for 10 minutes. The electrodeposited layer was annealed at 1020° C. in a mixture of Ar gas provided at 60 pounds per square inch (psi) and a forming gas [$H_2$ (10%)/$N_2$] provided at 2.5 psi for 2 hours.

Electrodeposited $CeO_2$:Zr. In this example, biaxially textured $CeO_2$:Zr was prepared on a Ni—W substrate. Specifically, 0.5 g cerium bromide and 0.18 g zirconium bromine was dissolved in 200 mL of water. The layer was electrodeposited by applying 0.4 $mA/cm^2$ current density at room temperature (about 22° C.) for 5 minutes. The electrodeposited layer was annealed at 1020° C. in a mixture of Ar gas provided at 60 psi and forming gas [$H_2$ (10%)/$N_2$] provided at 2.5 psi for 2 hours.

Electrodeposited $La_2O_3$. In this example, biaxially textured $La_2O_3$ was prepared on a Ni—W substrate. Specifically, 0.1 g lanthanum bromide was dissolved in a mixture of 100 mL of water (20%) and isopropyl alcohol (80%). The layer was electrodeposited by applying 0.4 mA/cm² current density at room temperature (about 22° C.) for 10 minutes. The electrodeposited layer was annealed at 1030° C. in a mixture of Ar gas (95%) and 5% forming gas [H₂ (10%)/N₂].

Electrodeposited Iridium (Ir). In this example, biaxially textured iridium was prepared on a Ni—W substrate. Specifically, 0.5 g iridium bromide was dissolved in 100 mL of water. The layer was electrodeposited by applying 1 mA/cm² current density at 65° C. for 15 minutes.

Electrodeposited Ni—Ir. In this example, biaxially textured Ni—Ir was prepared on a Ni—W substrate. Specifically, 66 g NiSO₄, 9 g NiCl₂, 7.6 g boric acid, and 0.5 g IrBr₃ was dissolved in 250 mL of water. The layer was electrodeposited by applying 0.4 mA/cm² current density at 65° C. for 15 minutes.

Electrodeposited Ni. In this example, biaxially textured Ni was prepared on a Ni—W substrate. Specifically, 66 g NiSO₄, 9 g NiCl₂, and 7.6 g boric acid was dissolved in 250 mL of water. The layer was electrodeposited by applying 0.4 mA/cm² current density at 65° C. for 60 minutes.

Electrodeposited YSZ (Y₂O₃ Stabilized ZrO₂). In this example, biaxially textured YSZ was prepared on a Ni—W substrate. Specifically, 2.1 g zirconium bromide and 0.05 g yttrium bromine was dissolved in 100 mL of water. The layer was electrodeposited by applying 3 mA/cm² current density at room temperature (about 22° C.) for 10 minutes.

Electrodeposited Y₂O₃. In this example, biaxially textured Y₂O₃ was prepared on a Ni—W substrate. Specifically, 0.5 g yttrium bromide was dissolved in a mixture of 100 mL of water (30%) and isopropyl alcohol (70%). The layer was electrodeposited by applying 0.8 mA/cm² current density at room temperature (about 22° C.) for 15 minutes. The electrodeposited layer was annealed at 980° C. in a mixture of Ar gas (95%) and a 5% forming gas [H₂ (10%)/N₂].

In another example, biaxially textured Y₂O₃ was prepared on a Ni—W as follows: 0.5 g yttrium bromide was dissolved in 200 mL of isopropyl alcohol (isopropanol). The layer was electrodeposited by applying 0.1 mA/cm² current density at room temperature (about 22° C.) for 30 minutes. The solution was stirred during deposition. The electrodeposited layer was annealed at 1100° C. in a mixture of Ar gas provided at 20 psi and a forming gas [H₂ (10%)/N₂] provided at 2.5 psi.

In yet another example, biaxially textured Y₂O₃ was prepared on a Ni—W substrate as follows: 1.0 g yttrium bromide was dissolved in 200 mL of water. The layer was electrodeposited by applying 0.8 mA/cm² current density at room temperature (about 22° C.) for 20 minutes. The solution is stirred during deposition. The electrodeposited layer was annealed at 1100° C. in a mixture of Ar gas provided at 20 psi and a forming gas [H₂ (10%)/N₂] provided at 2.5 psi.

Electrodeposited La—Mn—O. In this example, biaxially textured La—Mn—O was prepared on a Ni—W substrate. Specifically, 0.7 g lanthanum bromide and 0.6 g Manganese bromide were dissolved in 200 mL of water. The layer was electrodeposited by applying 0.8 mA/cm² current density at room temperature (about 22° C.) for 15 minutes. The electrodeposited layer was annealed at 990° C. in a mixture of Ar gas (95%) and a 5% forming gas [H₂ (10%)/N₂].

Electrodeposited CeO₂ on Electrodeposited Y₂O₃/Ni—W. In this example, biaxially textured CeO₂ was prepared on a Y₂O₃/Ni—W substrate. First, 0.5 g yttrium bromide was dissolved in 200 mL of isopropanol. The Y₂O₃ layer was electrodeposited by applying 0.1 mA/cm² current density at room temperature (about 22° C.) for 30 minutes on a Ni—W substrate. The solution was stirred during deposition to form the Y₂O₃/Ni—W substrate.

Then electrodeposited CeO2 was electrodeposited on the Y₂O₃/Ni—W substrate. Specifically, 0.5 g cerium bromide and 0.01 g samarium bromine was dissolved in 200 mL of water. The CeO₂ layer was electrodeposited by applying 0.26 mA/cm² current density. The electrodeposited layer was annealed at 990° C. in a mixture of Ar gas (95%) and a 5% forming gas [H₂ (10%)/N₂].

It is noted that the examples discussed above are provided for purposes of illustration and are not intended to be limiting. Still other embodiments and modifications are also contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A method of producing at least one biaxially textured layer on a biaxially textured substrate, comprising electrodepositing on the substrate a CeO₂ doped with a bromine based, precursor material to form a buffer layer wherein said buffer layer has a roughness of about 3 nm and an in-plane and out-of-plane alignment of less than seven degrees.

2. The method of claim 1, wherein the substrate further comprises electrodeposited Y₂O₃.

3. The method of claim 1, wherein electrodepositing is at a current density in the range of about 0.05 to 25 mA/cm².

4. The method of claim 1, wherein electrodepositing is during stirring of a bath containing the precursor material.

5. The method of claim 1, wherein electrodepositing is in the range of about 20° C. to 100° C.

6. The method of claim 1, wherein electrodepositing is at about room temperature.

7. The method of claim 1, wherein electrodepositing is for about 1 to 30 minutes.

8. The method of claim 1, further including annealing the biaxially textured layer at about 700 to 1200° C.

9. The method of claim 1, further including annealing the biaxially textured layer in a gas mixture.

10. The method of claim 1, further including annealing the biaxially textured layer.

11. The method of claim 1 wherein the bromine based precursor material further includes Sm, Gd or Zr.

12. A method of producing a superconducting material having at least one biaxially textured layer, comprising:
    selecting a CeO₂ doped with a bromine based precursor material to form a buffer layer wherein said layer has a roughness of about 3 nm and an in-plane and out-of-plane alignment of less than seven degrees; and
    electrodepositing the selected precursor material on a biaxially textured substrate.

13. The method of claim 12, further comprising constantly stirring a bath with the precursor material during the step of electrodepositing.

14. The method of claim 12, further comprising thermally annealing the electrodeposited precursor material.

15. The method of claim 12, wherein the biaxially textured substrate is Ni-based.

16. The method of claim 12 wherein the bromine based precursor material further includes Sm, Gd or Zr.

* * * * *